United States Patent
Kubota et al.

(10) Patent No.: US 11,932,936 B2
(45) Date of Patent: Mar. 19, 2024

(54) METHOD FOR PRODUCING A GROUP III COMPOUND CRYSTAL BY HYDRIDE VAPOR PHASE EPITAXY ON A SEED SUBSTRATE FORMED ON A GROUP III NITRIDE BASE SUBSTRATE

(71) Applicant: SHIN-ETSU CHEMICAL CO., LTD., Tokyo (JP)

(72) Inventors: Yoshihiro Kubota, Takasaki (JP); Kazutoshi Nagata, Tomioka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 51 days.

(21) Appl. No.: 17/628,745

(22) PCT Filed: Jun. 16, 2020

(86) PCT No.: PCT/JP2020/023611
§ 371 (c)(1),
(2) Date: Jan. 20, 2022

(87) PCT Pub. No.: WO2021/014834
PCT Pub. Date: Jan. 28, 2021

(65) Prior Publication Data
US 2022/0267897 A1  Aug. 25, 2022

(30) Foreign Application Priority Data

Jul. 25, 2019  (JP) ................................ 2019-137310
Sep. 30, 2019  (JP) ................................ 2019-180194

(51) Int. Cl.
*C30B 25/18* (2006.01)
*C23C 16/34* (2006.01)
*C30B 29/38* (2006.01)

(52) U.S. Cl.
CPC .............. *C23C 16/34* (2013.01); *C30B 25/18* (2013.01); *C30B 29/38* (2013.01)

(58) Field of Classification Search
CPC ......... C30B 25/00; C30B 25/02; C30B 25/10; C30B 25/14; C30B 25/16; C30B 25/18;
(Continued)

(56) References Cited

U.S. PATENT DOCUMENTS 9,997,391 B2    6/2018  Odnoblyudov et al.
2006/0118513 A1  6/2006  Faure et al.
(Continued)

FOREIGN PATENT DOCUMENTS

EP    2 243 866 A1    10/2010
JP    2006-528592 A    12/2006
(Continued)

OTHER PUBLICATIONS

Extended European Search Report dated Jun. 23, 2023, in corresponding European Patent Application No. 20842948.0 citing document 15 therein, 8 pages.
(Continued)

*Primary Examiner* — Kenneth A Bratland, Jr.
(74) *Attorney, Agent, or Firm* — Oblon, McClelland, Maier & Neustadt, L.L.P.

(57) ABSTRACT

The present invention relates to a method for producing a group III compound substrate, including: a base substrate forming step for forming a group III nitride base substrate by a vapor phase synthesis method; a seed substrate forming step for forming a seed substrate on the base substrate; and a group III compound crystal forming step for forming a group III compound crystal on the seed substrate by a hydride vapor phase epitaxy method. The group III compound substrate of the present invention is produced by the method for producing a group III compound substrate of the
(Continued)

present invention. According to the present invention, a large-sized and high-quality group III compound substrate can be obtained at a low cost while taking advantage of the high film formation rate characteristic of the hydride vapor phase epitaxy method.

14 Claims, 1 Drawing Sheet

(58) Field of Classification Search
CPC ..... C30B 25/183; C30B 25/186; C30B 25/20; C30B 29/00; C30B 29/10; C30B 29/40; C30B 29/403; C30B 29/406; C23C 16/02; C23C 16/0272; C23C 16/22; C23C 16/30; C23C 16/301; C23C 16/303; C23C 16/34
USPC ...... 117/84, 88–90, 94–95, 97–98, 104–107, 117/937, 952
See application file for complete search history.

(56) References Cited

U.S. PATENT DOCUMENTS

| | | | | |
|---|---|---|---|---|
| 2007/0196942 | A1* | 8/2007 | Kitaoka | ............ H01L 21/02579 438/46 |
| 2009/0229743 | A1 | 9/2009 | Faure et al. | |
| 2010/0190000 | A1* | 7/2010 | Faure | ................ H01L 21/76254 156/247 |
| 2013/0032928 | A1* | 2/2013 | Satoh | ................ H01L 21/76254 257/E29.089 |
| 2016/0186361 | A1* | 6/2016 | Koukitu | ............ H01L 21/02458 117/88 |
| 2019/0119112 | A1* | 4/2019 | Yoshida | ................. C30B 25/20 |

FOREIGN PATENT DOCUMENTS

| | | | | |
|---|---|---|---|---|
| JP | 2012-116741 | A | | 6/2012 |
| JP | 6203460 | B1 | | 9/2017 |
| JP | 2017-210391 | A | | 11/2017 |
| JP | 2017210391 | A | * | 11/2017 |
| JP | 6331553 | B2 | | 5/2018 |
| WO | WO-2017154701 | A1 | * | 9/2017 ......... C01B 21/0632 |
| WO | WO 2019/054444 | A1 | | 3/2019 |

OTHER PUBLICATIONS

International Search Report dated Sep. 8, 2020 in PCT/JP2020/023611 filed on Jun. 16, 2020, (2 pages).
International Search Report dated Sep. 8, 2020 in PCT/JP2020/023611 filed Jun. 16, 2020, (2 pages).
Yoshida et al., "Development of GaN substrate with a large diameter and small orientation deviation", Phys. Status Solidi B, 2017, vol. 254, No. 8, 1600671, pp. 1-4.

* cited by examiner

METHOD FOR PRODUCING A GROUP III COMPOUND CRYSTAL BY HYDRIDE VAPOR PHASE EPITAXY ON A SEED SUBSTRATE FORMED ON A GROUP III NITRIDE BASE SUBSTRATE

TECHNICAL FIELD

The present invention relates to a method for producing a group III compound substrate, such as a GaN-based substrate or an AlN-based substrate, which is large in size, has very little warpage, voids or lattice defects, has high characteristics and has high quality, and a substrate produced by the production method, and more particularly to a method for producing a large-sized, high-quality GaN substrate or a large-sized, high-quality AlN substrate, and a GaN substrate or an AlN substrate produced by the production method.

BACKGROUND ART

A substrate of a group III compound such as a crystalline GaN-based or AlN-based compound has a wide band gap and has excellent high-frequency characteristics such as light emission at an extremely short wavelength and a high breakdown voltage. For this reason, substrates of group III compounds are expected to be applied to devices such as lasers, Schottky diodes, power devices, and high-frequency devices. However, since it is difficult to grow a large-sized and high-quality crystal of these group III compounds at present, the cost becomes high, which prevents expansion of applications and wide spread of these substrates.

For example, in the case of a GaN substrate, a bulk GaN substrate obtained by growing a GaN crystal in a liquid such as liquid ammonia or Na flux generally has relatively high quality. However, since a high-temperature and high-pressure device is required, it is difficult to increase the size (large diameter and thick). On the other hand, if GaN is heteroepitaxially grown or homoepitaxially grown on a single-crystal substrate such as a sapphire substrate, a GaAs substrate, an SiC substrate, an SCAM (ScAlMgO$_4$) substrate, a GaN substrate, or an AlN substrate by metal-organic chemical vapor deposition method (MOCVD method) or hydride vapor phase epitaxy method (HVPE method, THVPE method, etc.), a large-sized, high-quality substrate can be produced in principle. However, in practice, single crystal substrates such as GaN substrates and SCAM substrates, which have the same or relatively close lattice constant and thermal expansion coefficient to GaN crystals, are currently only manufactured in small sizes, and there are no large single crystal substrates, which makes it difficult to increase the size of the substrate by epitaxial film formation.

As a countermeasure, NPTL 1 describes that a plurality of tile-shaped substrates obtained by cutting a GaN single crystal obtained by an Na flux method into a honeycomb shape are bonded on a susceptor made of pyrolytic graphite (PG) to enlarge the GaN single crystal, the enlarged GaN single crystal is used as a seed substrate, and GaN is grown thereon by an HVPE method or the like to obtain a large-sized GaN substrate. Further, PTL 1 describes that a plurality of tile-shaped substrates obtained by cutting a GaN single crystal obtained by a known method such as a vapor phase method into a honeycomb shape are bonded on a susceptor made of pyrolytic graphite (PG) to enlarge the GaN single crystal, the enlarged GaN single crystal is used as a seed substrate, and GaN is grown thereon by an HVPE method or the like to obtain a large-sized GaN substrate. However, in these methods, since there is a large difference in coefficient of thermal expansion between the PG susceptor, which can also be referred to as a base substrate, an alumina-based adhesive or zirconia-based adhesive used for bonding the PG susceptor to the seed substrate, and the tile-shaped GaN single crystal or SCAM single crystal serving as the seed substrate, the seed substrate moves, peels, warps, or the like due to expansion and contraction caused by temperature change, and it is difficult to maintain the crystal orientation and the same planarity during the film formation reaction period, and thus it is difficult to form a film having a uniform orientation.

On the other hand, it has been attempted to produce a large-sized GaN substrate by using a single crystal substrate such as an Si substrate, a sapphire substrate, an SiC substrate, or a GaAs substrate, which is relatively available as a large-diameter product, as a base substrate and a seed substrate. However, due to a large mismatch in lattice constant and thermal expansion coefficient between the single crystal substrate and the GaN crystal, various defects increase in the GaN substrate obtained by epitaxial film formation, and warpage and cracking are likely to occur, which is a problem.

As one solution, there has been proposed an attempt to obtain a large-sized GaN substrate by adding a sintering aid to a polycrystalline powder of GaN or AlN having the same or similar lattice constant and thermal expansion coefficient, or a powder of mullite composition as described in PTL 2, sintering it to prepare a ceramic, using the resulting ceramic as a base substrate, transferring and bonding a single-crystal thin film such as an Si substrate, a sapphire substrate, an SiC substrate, a GaAs substrate, a GaN substrate or an AlN substrate onto the base substrate to prepare a seed substrate, and then heteroepitaxially growing GaN on the seed substrate. However, in this method, metal impurities in the ceramic raw material or caused by the sintering aid or the like diffuse and contaminate during epitaxial GaN film formation, and it is difficult to obtain a substrate having high characteristics.

For this reason, as one of the improvement measures, PTL 3 proposes that an AlN ceramic having a coefficient of thermal expansion relatively close to that of GaN is used as a base substrate, the entire substrate is wrapped and sealed with a multilayer film of an inorganic material such as Si, SiO$_2$ or Si$_3$N$_4$, and then SiO$_2$ is stacked thereon, a thin film of Si<111> of a seed substrate is transferred and bonded thereto, and then GaN is epitaxially formed thereon to prevent diffusion of metallic impurities from the base substrate. However, since many processes are required for wrapping and sealing with the multi-layered inorganic material, the cost becomes high, which is not economical, and it is extremely difficult to secure a perfect hermetic sealing property by the multilayer film.

CITATION LIST

Patent Literature

PTL 1: JP 6203460 B
PTL 2: JP 6331553 B
PTL 3: U.S. Pat. No. 9,997,391 B2

Non-Patent Literature

NPTL 1; Phys. Status Solidi B 254, No. 8,1600671 (2017)

SUMMARY OF INVENTION

Technical Problem

The present invention has been made in view of the above circumstances, and an object thereof is to provide a method for producing a large-sized and high-quality group III compound substrate such as a GaN-based substrate or an AlN-based substrate, and a group III compound substrate obtained by the method, particularly a GaN substrate or an AlN substrate.

Solution to Problem

In order to achieve the above object, the present invention provides the following method for producing a group III compound substrate and a substrate thereof.

That is, the present invention relates to the following [1] to [17].

[1] A method for producing a group III compound substrate, including;

a base substrate forming step for forming a group III nitride base substrate by a vapor phase synthesis method;

a seed substrate forming step for forming a seed substrate on the base substrate; and a group III compound crystal forming step for forming a group III compound crystal on the seed substrate by a hydride vapor phase epitaxy method.

[2] The method for producing a group III compound substrate as set forth in [1], wherein the hydride vapor phase epitaxy method used in the group III compound crystal forming step is a THVPE method.

[3] The method for producing a group III compound substrate as set forth in [1] or [2], wherein the group III nitride of the base substrate is GaN or AlN, the seed substrate is a substrate of Si<111>, sapphire, SiC, GaAs, SCAM (ScAlMgO$_4$), or GaN, wherein in the seed substrate forming step, the seed substrate is formed on the base substrate by thin film transfer of the seed substrate to the base substrate, and wherein in the group III compound crystal forming step, the group III compound crystal is formed on the seed substrate using a group III chloride and NH$_3$ as vapor phase epitaxy raw materials.

[4] The method for producing a group III compound substrate as set forth in any one of [1] to [3], wherein the base substrate is a substrate of at least one material selected from the group consisting of amorphous, polycrystal, single crystal, and ceramics of a group III nitride, and wherein the total content of metal impurities other than group III metal elements in the base substrate is 5000 ppm by mass or less in terms of metal.

[5] The method for producing a group III compound substrate as set forth in any one of [1] to [4], wherein in the base substrate forming step, a group III nitride base substrate is formed by a hydride vapor phase epitaxy method.

[6] The method for producing a group III compound substrate as set forth in any one of [1] to [5], wherein the base substrate is a substrate obtained by molding a powder of a group III nitride obtained by a hydride vapor phase epitaxy method to prepare a molded body, incorporating a group III metal into the molded body by an impregnation method, and sintering the molded body, or a substrate obtained by molding a powder of a group III nitride obtained by a hydride vapor phase epitaxy method to prepare a molded body, incorporating a group III compound that becomes a group III metal upon reduction into the molded body by an impregnation method, and nitriding and sintering the molded body.

[7] The method for producing a group III compound substrate as set forth in any one of [1] to [5], wherein the base substrate is a substrate obtained by preparing a mixture by adding and mixing a group III metal to a powder of a group III nitride obtained by a hydride vapor phase epitaxy method, molding the mixture to prepare a molded body, and nitriding and sintering the molded body.

[8] The method for producing a group III compound substrate as set forth in any one of [1] to [7], wherein the group III compound crystal is a gallium nitride (GaN) crystal or an aluminum nitride (AlN) crystal.

[9] The method for producing a group III compound substrate as set forth in any one of [1] to [8], further including an N-face group III nitride layer forming step of forming an N-face group III nitride layer on the seed substrate between the seed substrate forming step and the group III compound crystal forming step.

[10] The method for producing a group III compound substrate as set forth in [9], wherein in the N-face group III nitride layer forming step, the N-face group III nitride layer is formed on the seed substrate by a low-temperature MOCVD method at a temperature of 400 to 800° C. or by a THVPE method.

[11] The method for producing a group III compound substrate as set forth in [10], wherein in the N-face group III nitride layer forming step, the N-face group III nitride layer is formed on the seed substrate by a low-temperature MOCVD method at a temperature of 500 to 600° C.

[12] The method for producing a group III compound substrate as set forth in any one of [1] to [11], wherein the thickness of the seed substrate or the sum of the thickness of the seed substrate and the thickness of the N-face group III nitride layer formed in the N-face group III nitride layer forming step is 50 to 2000 nm.

[13] The method for producing a group III compound substrate as set forth in any one of [1] to [12], further including a peeling layer forming step of forming a peeling layer made of a material having a peelable cleavage property on the base substrate, wherein in the seed substrate forming step, a seed substrate is formed on the peeling layer.

[14] The method for producing a group III compound substrate as set forth in [13], wherein the material having a peelable cleavage property is at least one material selected from the group consisting of SCAM (ScAlMgO$_4$) crystal, boron nitride (BN), and graphite.

[15] The method for producing a group III compound substrate as set forth in [13] or [14], further including an intermediate layer forming step of forming an intermediate layer on the peeling layer, wherein the intermediate layer is a film of an Si-based compound, and in the seed substrate forming step, a seed substrate is formed on the intermediate layer.

[16] The method for producing a group III compound substrate as set forth in any one of [1] to [14], further including an intermediate layer forming step of forming an intermediate layer on the base substrate, wherein the intermediate layer is a film of an Si-based compound, and in the seed substrate forming step, a seed substrate is formed on the intermediate layer.

[17] A group III compound substrate produced by the method for producing a group III compound substrate according to any one of [1] to [16].

Advantageous Effects of Invention

According to the present invention, a large-sized and high-quality group III compound substrate can be obtained at a low cost while taking advantage of the high film formation rate characteristic of the hydride vapor phase epitaxy method. That is, since an extremely thick group III compound substrate having a large diameter and no variation can be produced, a group III compound substrate having a large diameter which is excellent in crystal characteristics of the substrate and is low in cost can be easily obtained.

DESCRIPTION OF EMBODIMENTS

Figure 1:
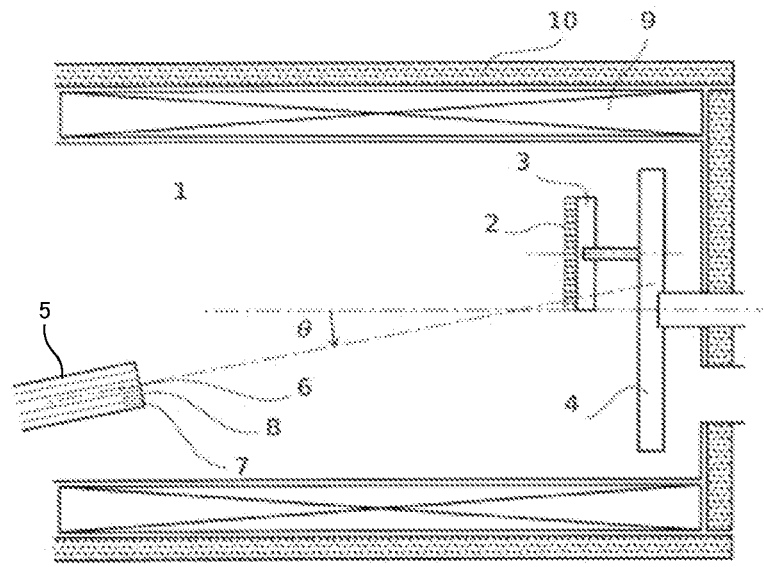
FIG. 1 is a view for explaining a reaction apparatus used for preparing a base substrate and forming a crystal on a seed substrate in Example 1.

[Method for Producing Group III Compound Substrate]

The method for producing a group III compound substrate of the present invention includes: a base substrate forming step for forming a group III nitride base substrate by a vapor phase synthesis method; a seed substrate forming step for forming a seed substrate on the base substrate; and a group III compound crystal forming step for forming a group III compound crystal on the seed substrate by a hydride vapor phase epitaxy method. As a result, a high-purity and large-sized group III nitride base substrate can be formed, and a group III compound substrate having a large diameter and an extremely large thickness without variation can be produced. Therefore, a group III compound substrate having a large diameter and excellent in crystal characteristics of the substrate and low in cost can be easily obtained. Each step will be described in detail below.

(Base Substrate Forming Step)

In the base substrate forming step, a group III nitride base substrate is formed by a vapor phase synthesis method. As a result, since a high-purity base substrate can be obtained, when a group III compound crystal is formed on a seed substrate by a hydride vapor phase epitaxy method, diffusion and contamination of metal impurities from the base substrate into the group III compound crystal can be suppressed. From the viewpoint of obtaining a high-purity base substrate, it is particularly preferable to form a group III nitride base substrate by a hydride vapor phase epitaxy method. The group III nitride of the base substrate is preferably GaN or AlN.

The base substrate is preferably a substrate of at least one material selected from the group consisting of amorphous, polycrystal, single crystal, and ceramics of a group III nitride. In particular, when the group III compound substrate to be obtained is a GaN substrate or an AlN substrate, the base substrate is preferably any one of amorphous, polycrystal, single crystal, and ceramics of GaN or AlN having a coefficient of thermal expansion closer to that of the GaN substrate or the AlN substrate, or a mixture thereof.

The base substrate is preferably a substrate obtained by molding a powder of a group III nitride obtained by a hydride vapor phase epitaxy method to prepare a molded body, incorporating a group III metal into the molded body by an impregnation method, and sintering the molded body, or a substrate obtained by molding a powder of a group III nitride obtained by a hydride vapor phase epitaxy method to prepare a molded body, incorporating a group III compound that becomes a group III metal upon reduction into the molded body by an impregnation method, and nitriding and sintering the molded body. In addition, the base substrate may be a substrate obtained by preparing a mixture by adding and mixing a group III metal to a powder of a group III nitride obtained by a hydride vapor phase epitaxy method, molding the mixture to prepare a molded body, and nitriding and sintering the molded body. Thus, a base substrate having a large diameter and high purity can be produced at a low cost.

It is also possible to form the base substrate by using gallium nitride powder produced by heating high-purity $Ga_2O_3$ powder in an ammonia atmosphere instead of the group III nitride obtained by the hydride vapor phase epitaxy method. In this case, in the base substrate forming step, the base substrate is formed using a powder of group III nitride obtained by nitriding a powder of group III oxide. The base substrate may be a substrate obtained by molding a powder of group III nitride obtained by nitriding a powder of group III oxide to form a molded body, incorporating a group III metal into the molded body by an impregnation method, and sintering the molded body, or a substrate obtained by molding a powder of group III nitride obtained by nitriding a powder of group III oxide to form a molded body, incorporating a group III compound that becomes a group III metal upon reduction into the molded body by an impregnation method, and nitriding and sintering the molded body. In addition, the base substrate may be a substrate obtained by adding and mixing a group III metal to a powder of group III nitride obtained by nitriding a powder of group III oxide to prepare a mixture, molding the mixture to prepare a molded body, and then nitriding and sintering the molded body. By using a high-purity group III oxide, a large-diameter and high-purity base substrate can be produced at a low cost.

When the base substrate is a GaN substrate or an AlN substrate, for example, the base substrate can be produced using GaN or AlN powder prepared in the following manner.

As a method for preparing the GaN or AlN powder, the GaN or AlN powder can be prepared by directly nitriding Ga metal or Al metal in a $NH_3$ atmosphere, or the GaN or AlN powder can be prepared by causing an arc plasma reaction of Ga metal or Al metal in $NH_3$.

Alternatively, the GaN powder or the AlN powder can also be prepared by nitriding Ga metal or Al metal while pulverizing it in $N_2$ or $NH_3$.

A GaN or AlN substrate can be produced by adding a sintering aid such as $SiO_2$, a binder, or the like to the GaN powder or AlN powder obtained in this manner, then mixing, molding, and sintering.

However, these methods are not suitable for the base substrate forming step in the method for producing a group III compound substrate of the present invention, because many impurities are mixed from a pulverizing vessel or pulverizing media used in producing, particularly in pulverizing raw material metals, or many electrode components are contaminated due to consumption of an arc electrode, and many metal impurities other than Ga or Al are mixed.

On the other hand, as a method for producing a base substrate suitable for the method for producing a group III compound substrate of the present invention, for example, there is a method in which Ga metal, Al metal, or a halide thereof is subjected to a vapor phase oxidation reaction to obtain $Ga_2O_3$ powder or $Al_2O_3$ powder, these are molded to prepare a molded body, and then the molded body is nitrided in a reducing atmosphere such as $N_2$ or $NH_3$. However, in this method for producing a base substrate, it is difficult to control mixing of oxygen in the base substrate. Therefore, as a particularly preferable method for producing a base substrate, the following method can be used in which a GaN substrate or an AlN substrate having a total content of metal impurities other than Ga or Al of 5000 ppm by mass or less can be produced without the above-described problem of controlling mixing of oxygen.

Particularly preferable examples of the method for producing the base substrate include: a method of directly obtaining a GaN or AlN substrate by performing the hydride vapor phase epitaxy method under reduced pressure using high-purity Ga chloride or Ga bromide, or Al chloride or Al bromide, and $NH_3$ as raw materials; a method of obtaining a GaN or AlN substrate by performing the above-mentioned vapor phase epitaxy method at atmospheric pressure or higher to obtain high-purity GaN or AlN powder and then pressure-molding and sintering the powder; a method for obtaining a GaN or AlN substrate by adding a high-purity Ga metal or a high-purity Al metal to the GaN or AlN powder, mixing the same, subjecting the mixture to pressure molding to prepare a molded body, sintering the molded body, and nitriding the Ga metal or the Al metal in the molded body in order to improve the moldability of the GaN or AlN powder; and a method for obtaining a GaN or AlN substrate by obtaining a high-purity GaN or AlN powder, pressure molding the powder to prepare a molded body, impregnating the molded body with a Ga metal or an Al metal, sintering the impregnated molded body, and nitriding the Ga metal or the Al metal in the molded body.

Further, in the case where the substrate thus obtained has a low density and is porous, there may be provided a step of impregnating the pores of the substrate with a high-purity Ga metal or a high-purity Al metal, followed by nitriding and sintering to densify the substrate. Instead of obtaining high-purity GaN or AlN powder by performing the above-mentioned vapor phase epitaxy method at atmospheric pressure or higher, high-purity GaN powder or high-purity AlN powder can be obtained by heating high-purity $Ga_2O$ powder or $Al_2O_3$ powder in an ammonia atmosphere, and a GaN or AlN base substrate can be obtained using this.

The total content of metal impurities other than group III metal elements in the base substrate is preferably 5000 ppm by mass or less in terms of metal. When the total content of metal impurities other than group III metal elements in the base substrate is 5000 ppm by mass or less in terms of metal, diffusion of impurities from the base substrate into the group III compound crystal can be suppressed, and a group III compound substrate having high characteristics can be obtained. For example, in the case where the base substrate is a GaN substrate, the total content of metal impurities other than Ga is preferably 5000 ppm by mass or less in terms of metal. In addition, when the base substrate is an AlN substrate, the total content of metal impurities other than Al is preferably 5000 ppm by mass or less in terms of metal.

(Seed Substrate Forming Step)

In the seed substrate forming step, a seed substrate is formed on a base substrate. The seed substrate is preferably formed on the base substrate by thin film transfer of the seed substrate to the base substrate. The seed substrate is preferably a substrate of Si<111>, sapphire, SiC, GaAs, SCAM (ScAlMgO₄), or GaN. Furthermore, the seed substrate preferably has a thickness of 50 to 2000 nm. When the thickness of the seed substrate is 50 nm or more, the effect of the seed substrate can be sufficiently exhibited, and the generation of many defects during film formation can be suppressed. When the thickness of the seed substrate is 2000 nm or less, the seed substrate can be prevented from warping or from cracking or peeling off the seed substrate. If the seed substrate is formed on the base substrate, the seed substrate may be formed directly on the base substrate, or the seed substrate may be formed on the base substrate with at least one layer interposed between the seed substrate and the base substrate.

In particular, when the base substrate is a GaN substrate or an AlN substrate, the seed substrate is preferably a substrate of Si<111>, sapphire, SiC, GaAs, SCAM (ScAlMgO₄), or GaN. This is because Si<111>, sapphire, SiC, GaAs, SCAM (ScAlMgO₄), or GaN has the same or similar crystal structure as GaN or AlN.

Various methods are used as the thin film transfer method. However, it is most preferable to transfer a uniform thin film to a base substrate through the steps of implanting ions of H, Ar, or the like into the surface of a seed substrate supply substrate of Si<111>, sapphire, SiC, GaAs, SCAM (ScAlMgO₄), or GaN, bonding the ion-implanted surface portion to the base substrate, and peeling the ion-implanted surface portion bonded to the base substrate from the seed substrate supply substrate.

(Group III Compound Crystal Forming Step)

In the group III compound crystal forming step, a group III compound crystal is formed on the seed substrate by a hydride vapor phase epitaxy method. In particular, in the group III compound crystal forming step, it is preferable to form a group III compound crystal on the seed substrate using a group III chloride and $NH_3$ as vapor phase epitaxy raw materials. Furthermore, the group III compound crystal is preferably a gallium nitride (GaN) crystal or an aluminum nitride (AlN) crystal. In addition, it may be a group III compound crystal of a two element system or a multi-element system such as a three element system to which Al, In, Ga or the like is added in order to improve the characteristics of the substrate. If necessary, the group III compound crystal may contain various dopants. If the group III compound crystal is formed on the seed substrate, the group III compound crystal may be formed directly on the seed substrate, or the group III compound crystal may be formed on the seed substrate with at least one layer interposed between the group III compound crystal and the seed substrate.

For example, when a large-sized and high-quality GaN-based or AlN-based group III compound single crystal is produced by the hydride vapor phase epitaxy method, it is preferable to grow the GaN-based or AlN-based crystal mainly using $GaCl_3$ or $AlCl_3$ and $NH_3$ as the vapor phase epitaxy raw materials. The hydride vapor phase epitaxy method can be selected from the HVPE method and the THVPE method depending on necessary crystal characteristics, but may be combined with the metal-organic chemical vapor deposition method (MOCVD method) in some cases. In general, the THVPE method in which the crystal growing rate is high and the crystal size increases with the growth is particularly preferable. The produced crystal may be used as it is as a substrate, or the produced crystal may be processed and the processed crystal may be used as a substrate. In some cases, the produced crystal may be used as a base substrate.

(N-face Group III Nitride Layer Forming Step)

The method for producing a group III compound substrate of the present invention may further include an N-face group III nitride layer forming step. In the N-face group III nitride layer forming step, an N-face group III nitride layer is formed on the seed substrate between the seed substrate forming step and the group III compound crystal forming step. Note that the N-face group III nitride layer is a group III nitride layer whose surface is a plane in which nitrogen atoms are arranged. As a result, it is possible to produce a group III compound substrate which is large, has extremely few warpage, voids, and lattice defects, and has high characteristics and high quality.

In the N-face group III nitride layer forming step, it is preferable to form an N-face group III nitride layer on the seed substrate by a low-temperature MOCVD method at a temperature of 400 to 800° C. or by a THVPE method. Thus, the N-face group III nitride layer can be easily formed on the seed substrate. In addition, when the N-face group III nitride layer is formed on the seed substrate by the low-temperature MOCVD method, it is more preferable to form the N-face group III nitride layer on the seed substrate at a temperature of 500 to 600° C.

Usually, the HYPE method tends to form a plane in which Ga atoms are arranged or a plane in which Al atoms are arranged on the upper surface, and the THVPE method using $GaCl_3$ or $AlCl_3$ as a raw material tends to form a plane in which N atoms are arranged on the upper surface. Therefore, when the N-face group III nitride layer is an N-face GaN layer or an N-face AlN layer, it is preferable to form the N-face group III nitride layer on the seed substrate by the THVPE method. In this case, from the viewpoint of the effect of the seed substrate described above, the total thickness of the seed substrate and the N-face group III nitride layer is preferably 50 to 2000 nm.

In addition, the N-face group III nitride layer may be formed on the seed substrate by a low-temperature MOCVD method at a film formation temperature of preferably 400 to 800° C., and more preferably 500 to 600° C. When the film formation temperature of the low-temperature MOCVD method is 400° C. or higher, an N-face group III nitride layer can be formed on the seed substrate in a short time, and the film quality of the N-face group III nitride layer can be improved. When the film formation temperature of the low-temperature MOCVD method is 800° C. or lower, formation of a plane in which Ga atoms are arranged or a plane in which Al atoms are arranged on the surface of the group III nitride layer is suppressed, and the N-face group III nitride layer can be easily formed.

(Peeling Layer Forming Step)

The method for producing a group III compound substrate of the present invention may further include a peeling layer forming step of forming a peeling layer made of a material having a peelable cleavage property on the base substrate. By providing the peeling layer between the base substrate and the seed substrate, the group III compound crystal grown on the seed substrate can be easily separated from the base substrate, and the base substrate can be recycled without loss. When the method for producing a group III compound substrate of the present invention further includes a peeling layer forming step, the seed substrate is formed on the peeling layer in the seed substrate forming step.

The material having a peelable cleavage property is preferably at least one material selected from the group consisting of SCAM ($ScAlMgO_4$) crystal having cleavage property, hexagonal boron nitride (BN) having a crystal structure easily peelable in layers, graphite, PBN (pyrolytic boron nitride) partially having a turbostratic structure, and PG (pyrolytic graphite), and more preferably at least one material selected from the group consisting of SCAM crystal, boron nitride, and graphite. When these materials are used for the peeling layer, after the crystal growth of the group III compound, the integrated product of the seed substrate and the produced group III compound crystal can be easily peeled from the surface layer of the peeling layer, and the integrated product of the seed substrate and the group III compound crystal can be easily recovered. In addition, the peeling layer on the base substrate remaining after recovery can be reused by finishing the surface of the peeling layer to be smooth by polishing or the like as necessary, which is economical. In order to provide the peeling layer on the base substrate, the peeling layer may be adhered to the base substrate by using an ordinary heat-resistant inorganic adhesive, or the peeling layer having an arbitrary thickness may be stacked on the base substrate by a physical method such as a reduced pressure vapor phase method or sputtering.

(Intermediate Layer Forming Step)

The method for producing a group III compound substrate of the present invention may further include an intermediate layer forming step. In the intermediate layer forming step, a film of an Si-based compound such as Si, $SiO_2$, $Si_3N_4$, or $SiO_xN_y$, is formed on the base substrate between the base substrate forming step and the seed substrate forming step, or on the peeling layer when the peeling layer is formed, as a base for forming the seed substrate. As a result, contamination with metal impurities from the base substrate or the peeling layer can be further suppressed, and a group III compound substrate that is large, has extremely few warpage, voids, and lattice defects, and has high characteristics and high quality can be produced. Among these Si-based compounds, $SiO_2$ and $Si_3N_4$ are preferable, and $SiO_2$ is more preferable. The method of forming the intermediate layer is not particularly limited, but it is preferable to form the intermediate layer by a plasma CVD (chemical vapor deposition) method or the like. After the intermediate layer is formed, the intermediate layer is preferably polished by chemical mechanical polishing (CMP) or the like.

[Group III Compound Substrate]

The group III compound substrate of the present invention is produced by the method for producing a group III compound substrate of the present invention.

According to the method for producing a group III compound substrate of the present invention, a group III compound substrate having a large diameter, no variation, and an extremely large thickness can be obtained for the first time. As a result, a low-cost substrate having excellent crystal characteristics can be obtained, and the group III compound substrate can be applied to devices such as lasers, power devices, and high-frequency devices, which have not been widely used in terms of characteristics and cost.

EXAMPLES

The present invention will be described more specifically with reference to Examples and Comparative Examples, but the present invention is not limited to these Examples.

Example 1

(1) Production of Base Substrate

Figure 2:
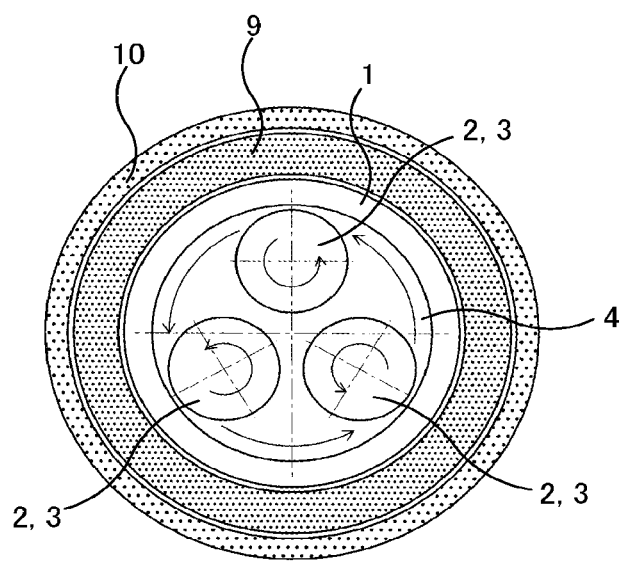
FIG. 2 is a view for explaining a reaction apparatus used for preparing a base substrate and forming a crystal on a seed substrate in Example 1.

With reference to FIG. 1 and FIG. 2, production of the base substrate in Example 1 will be described. A heat-insulating material 10 in the shape of a mat of alumina was placed in a stainless steel reaction apparatus (the inner surface of which was coated with a very thin zirconia by thermal spraying) having a water-cooling jacket and an exhaust port with an inner diameter of 1500 mm× a height of 1800 mm, and a heating device 9 (an inner diameter of 1000 mm× a height of 1300 mm) having a cylindrical rod-shaped SiC heater and a gas supply pipe 5 (the same material as the above-mentioned reaction apparatus, including a center pipe 6 with an inner diameter of 30 mm, a second pipe 8 with an inner diameter of 40 mm, and an outermost pipe 7 with an inner diameter of 50 mm) were provided inside the heat-insulating material 10. On the other hand, a susceptor revolution jig 4 made of φ 520 mm PBN-coated graphite was prepared, in which three susceptors 3 made of PBN (pyrolytic boron nitride) (manufactured by varying furnace internal pressure in a pulsed manner during the manufacture of PBN, whereby the PBN has a peelable cleavage property) having an easy interlayer peeling property of φ 170 mm were arranged and housed at an interval of 120°. While the susceptor surface was heated to 1250° C. by a heater, the susceptor revolution jig 4 was rotated at 10 rpm to revolve the susceptor 3, and each of the three susceptors 3 was rotated at 30 rpm by using the force of the revolution gear. After confirming the stability of the temperature and rotation of the susceptor, a $GaCl_3$ gas was supplied from the center pipe 6 of the triple pipe, a $NH_3$ gas from the outermost pipe 7, and a $N_2$ gas from the second pipe 8 between the center pipe 6 and the outermost pipe 7 to the inside 1 of the reaction apparatus to set the pressure in the reaction apparatus to 2 Torr to start THVPE reaction. GaN crystal 2 was formed on PBN by reaction for 30 hours at a film growth rate of about 30 μm/h as GaN film growth.

After cooling, the obtained GaN crystal was peeled from the PBN susceptor at a portion where interlayer peeling of PBN was likely to occur. Then, the peeled GaN crystal was turned into a disk of φ 155 mm by a lathe. The PBN layer of the disk was completely removed by grinding the disk with a fixed grindstone. Further, both surfaces of the disk were further polished using a grindstone until the thickness of the disk became 750 μm. Then, the GaN surface was mirror-finished by CMP to make the surface of the disk smooth, thereby producing a GaN base substrate. The difference in coefficient of thermal expansion between the GaN base substrate and the GaN single crystal was measured to be as small as about $0.1 \times 10^{-6}$/° C. The coefficient of thermal expansion of the GaN single crystal is about 5.6 ppm/K at 500° C.

(2) $SiO_2$ Film formation (Intermediate Layer Formation)

On the upper surface of the base substrate, an $SiO_2$ film was formed by stacking 0.5 μm of $SiO_2$ by a plasma CVD apparatus, and the $SiO_2$ film was lightly polished by CMP to make the $SiO_2$ film having a thickness of 0.4 μm.

(3) Thin Film Transfer of Seed Substrate

A hydrogen-ion-implanted surface of a C-face sapphire wafer into which hydrogen ions were implanted to a depth of 0.5 μm was bonded to the base substrate on which an $SiO_2$ film was formed, and a C-face sapphire thin film was peeled off from the C-face sapphire wafer and the C-face sapphire thin film having a thickness of 0.5 μm was transferred to the base substrate.

(4) Formation of N-face Group III Nitride Layer

On the seed substrate, a low-temperature MOCVD reaction was carried out for 3 hours at a film formation temperature of 550° C. using trimethylgallium (TMG) and $NH_3$ as raw materials, and stacking 0.6 μm of an N-face GaN crystal on the seed substrate. The total thickness of the seed substrate and the N-face GaN crystal was 1.1 μm.

(5) Production of Large-Sized, High-Quality GaN Substrate

A GaN crystal was formed on the seed substrate by continuing the THVPE reaction for 40 hours using the above-described seed substrate under the same conditions as when the base substrate was produced except that the apparatus used in the production of the base substrate was set to atmospheric pressure. The obtained GaN crystal was free from warpage and deformation even after cooling, and a large and thick GaN crystal was obtained. This GaN crystal was processed to φ 150 mm× thickness of about 10 mm by a lathe, and then subjected to diamond cutting and double-side polishing to produce seven GaN substrates of Example 1 of φ 150 mm× thickness of 625 μm.

(6) Evaluation of the Obtained GaN Substrate

Among the seven GaN substrates thus obtained, in the GaN substrate of the uppermost layer portion (the GaN substrate at the position farthest from the seed substrate), the average of three arbitrary points in the plane was 15 arcsec and the variation was 1 arcsec in the FWHM (Full Width at Half Maximum) of the X-ray rocking curve of the (100) plane, and this substrate was a substrate having extremely good crystallinity. On the other hand, in the GaN substrate of the lowermost layer portion (the GaN substrate closest to the seed substrate) among the seven substrates, the average of three arbitrary points in the plane was 55 arcsec and the variation was 8 arcsec in the FWHM of the X-ray rocking curve of the (100) plane, and the crystallinity was slightly inferior to that of the GaN substrate of the uppermost layer portion, but this substrate was also a substrate having good crystallinity. Incidentally, as a result of the chemical analysis of the surfaces of the above-described substrates, the metal contamination of the GaN substrate was below the detection limit in both the GaN substrate of the uppermost layer portion and the GaN substrate of the lowermost layer portion.

Further, as a result of observation of a stacking fault in a monochromatic Cathode Luminescence image, no stacking fault was observed in the GaN substrate of the uppermost layer portion. On the other hand, in the GaN substrate of the lowermost layer portion, a very slight stacking fault was observed, but the degree thereof was the same as that of the GaN substrate by the MOCVD method, which is said to have good crystallinity. From the above results, it was shown that the GaN substrate crystal of Example 1 was a large-sized and high-quality GaN crystal substrate.

Comparative Example 1

GaN powder was prepared by reacting Ga metal with arc plasma in a $NH_3$. This GaN powder was molded into a substrate by a press to prepare a molded body. The molded body was fired at a firing temperature of 1300° C. in a $NH_3$ atmosphere to produce a base substrate. Otherwise, the GaN substrate of Comparative Example 1 was produced by the same method as the method for producing the GaN substrate of Example 1. As a result of measuring the metal contamination of the GaN substrate of the uppermost layer portion, it was found that metal impurities such as Cu and Fe which seem to be from the Cu electrode of the arc plasma apparatus were mixed in the GaN substrate in a total amount of 8500 ppm by mass. Such a GaN substrate having a high content of metal impurities cannot be supplied to a device manufacturing line due to concern about contamination of the line. In addition, when the FWHM of the GaN substrate of Comparative Example 1 was measured, due to the influence of metal impurities, the average of three arbitrary points in the plane was 7800 arcsec and the variation was 3000 arcsec, and the GaN substrate of Comparative Example 1 was a substrate having extremely poor crystallinity.

Example 2

(1) Production of Base Substrate

In the apparatus used to produde the GaN substrate in Example 1, high-purity GaN powder was prepared by hydride vapor phase reaction using $GaCl_3$ and $NH_3$ as raw materials under positive pressure where the total pressure of $GaCl_3$ and $NH_3$ was 3 Torr at gauge pressure, i.e., normal pressure+3 Toor. To 100 parts by mass of the GaN powder, 1 part by mass of Ga metal was added and mixed to prepare a mixture. Under the conditions of a pressure of 30 $kg/cm^2$ and a temperature of 25° C., the mixture was pressurized and molded by a pressing press to prepare a molded body. The molded body was nitrided and sintered at a firing temperature of 1200° C. in a gas mixture atmosphere of 10 vol % $N_2$ gas and 90 vol % $NH_3$ gas to produce a base substrate.

(2) Thin Film Transfer of Seed Substrate

A φ 6-inch Si<111> was used in place of the C-face sapphire wafer. Si<111> was transferred to the base substrate in the same manner as in Example 1 except for the above.

(3) Formation of N-face Group III Nitride Layer

Reaction was carried out for 1 hour by the THVPE method under a temperature condition of 800° C., and an N-face GaN crystal was stacked on the seed substrate. The total thickness of the seed substrate and the N-face GaN crystal was 0.7 µm.

(4) Production of Large-Sized, High-Quality GaN Substrate

In the same manner as in Example 1, a GaN crystal was formed on the seed substrate, and the obtained GaN crystal was processed to produce a GaN substrate of Example 2.

(5) Evaluation of the Obtained GaN Substrate

Among the seven GaN substrates thus obtained, in the GaN substrate of the uppermost layer portion, the average of three arbitrary points in the plane was 20 arcsec and the variation was 1 arcsec in the FWHM of the X-ray rocking curve of the (100) plane, and this substrate was a substrate having extremely good crystallinity. On the other hand, in the GaN substrate of the lowermost layer portion among the seven substrates, the average of three arbitrary points in the plane was 45 arcsec and the variation was 4 arcsec in the FWHM of the X-ray rocking curve of the (100) plane, and the crystallinity was slightly inferior to that of the GaN substrate of the uppermost layer portion, but this substrate was also a substrate having good crystallinity. Incidentally, as a result of the chemical analysis of the surfaces of the above-described substrates, the metal contamination of the GaN substrate was below the detection limit in the GaN substrate of the uppermost layer portion. On the other hand, in the GaN substrate of the lowermost layer portion, Al was detected in the vicinity of the detection limit, but the detection level of Al was at a level at which there was no problem when the GaN substrate was used for a device. The other metal impurities were below the detection limit.

Further, as a result of observation of a stacking fault in a monochromatic Cathode Luminescence image, no stacking fault was observed at all in the GaN substrate of the uppermost layer portion and the GaN substrate of the lowermost layer portion, and it was found to be an excellent crystal. From the above results, it was shown that the GaN substrate crystal of Example 2 was a large-sized and high-quality GaN crystal substrate. It is presumed that the GaN substrate of Example 2 has good crystallinity and low metal impurities due to the effect of the N-face GaN layer stacked on the Si<111> of the seed substrate.

Example 3

(1) Production of Base Substrate

In the apparatus used to produce the GaN substrate in Example 1, high-purity GaN powder was prepared by hydride vapor phase reaction using $GaCl_3$ and $NH_3$ as raw materials under positive pressure where the total pressure of $GaCl_3$ and $NH_3$ was 3 Torr at gauge pressure, i.e., normal pressure+3 Toor. Under the conditions of a pressure of 30 $kg/cm^2$ and a temperature of 1050° C., the mixture was subjected to heating and press molding in a $N_2$ gas atmosphere using a heat pressing machine to produce a base substrate in the form of a φ 6-inch wafer.

(2) $SiO_2$ Film Formation (Intermediate Layer Formation)

On the upper surface of the base substrate, an $SiO_2$ film was formed by stacking 0.5 µm of $SiO_2$ by a plasma CVD apparatus, and the $SiO_2$ film was lightly polished by CMP to make the $SiO_2$ film having a thickness of 0.4 µm.

(3) Thin Film Transfer of Seed Substrate

A plurality of φ 2-inch SCAM substrates (thickness: 220 µm) were processed into a honeycomb shape. Using an inorganic adhesive, the plurality of the honeycomb-shaped SCAM substrates were attached to a separately prepared glass substrate so as to form a φ 7-inch disk. Then, hydrogen ions were implanted into the SCAM substrate to a depth of 1 µm, and the hydrogen ion-implanted surface of the SCAM substrate into which hydrogen ions were implanted was bonded to the base substrate on which an $SiO_2$ film was formed, thereby bonding the SCAM substrate to the base substrate. Then, the SCAM thin film was peeled off from the SCAM substrate, and the SCAM thin film having a thickness of 1 µm was transferred to the base substrate. The transferred SCAM thin film was lightly polished by CMP to make the SCAM thin film having a thickness of 0.7 µm, which was used as a seed substrate. Note that in Example 3, an N-face GaN crystal was not stacked on the seed substrate. The SCAM substrate remaining on the glass substrate after the SCAM thin film was peeled off could be used again as a seed substrate.

(4) Production of Large-Sized, High-Quality GaN Substrate

In the same manner as in Example 1, a GaN crystal was formed on the seed substrate, and the obtained GaN crystal was processed to produce a GaN substrate of Example 3. The obtained GaN crystal could be easily peeled off from the SCAM thin film as the seed substrate. Further, the GaN crystal was slightly colored in yellow in a region of several hundred µm from the seed substrate of the obtained GaN crystal, but the GaN crystal was not colored in the other region.

(5) Evaluation of the Obtained GaN Substrate

Among the seven GaN substrates thus obtained, in the GaN substrate of the uppermost layer portion, the average of three arbitrary points in the plane was 13 arcsec and the variation was 2 arcsec in the FWHM of the X-ray rocking curve of the (100) plane, and this substrate was a substrate having extremely good crystallinity. On the other hand, in the GaN substrate of the lowermost layer portion among the seven substrates, the average of three arbitrary points in the plane was 20 arcsec and the variation was 3 arcsec in the FWHM of the X-ray rocking curve of the (100) plane, and the crystallinity of the GaN substrate of the lowermost layer portion was substantially equal to the crystallinity of the GaN substrate of the uppermost layer portion. It is presumed that this is because the SCAM thin film was peeled off when GaN was formed on the SCAM thin film as the seed substrate, and stress relaxation occurred in the GaN during the film formation. Incidentally, as a result of the chemical analysis of the surfaces of the above-described substrates, the metal contamination of the GaN substrate was below the detection limit in the GaN substrate of the uppermost layer portion. In the GaN substrate of the lowermost layer portion, Al, Mg, and Sc were detected in the vicinity of the detection limit, but the detection levels of these elements were levels that did not cause a problem when the GaN substrate was used for a device. The other metal impurities were below the detection limit.

Comparative Example 2

(1) Production of Base Substrate

Al metal was pulverized for 300 hours while being nitrided at a temperature of 100° C. under a flow of a mixed gas of 20 vol % of $N_2$ gas and 80 vol % of $NH_3$ gas to prepare an AlN powder. $SiO_2$ and $Al_2O_3$ as sintering aids and poval (polyvinyl alcohol) as a binder were added to the obtained AlN powder, mixed, molded, and fired to produce a base substrate.

(2) Thin Film Transfer of Seed Substrate

Instead of the φ 2-inch SCAM substrate, a 2-inch GaN substrate produced with Na flux was used as a seed substrate. Note that the GaN substrate produced with Na flux does not exhibit cleavage property like the SCAM substrate. A φ 6-inch seed substrate was produced in the same manner as in Example 3 except for the above.

(3) Production of Large-Sized, High-Quality GaN Substrate

The $GaCl_3$ gas was changed to GaCl gas, and the film forming method was changed from the THVPE method to the HVPE method. A GaN substrate of Comparative Example 2 was produced by forming a GaN crystal on the seed substrate and processing the obtained GaN crystal in the same manner as in Example 3 except for the above. However, the flow rate of the GaCl gas was changed so that the supply amount of the Ga element was the same as that in the case of the $GaCl_3$ gas.

(4) Evaluation of the Obtained GaN Substrate

Among the seven GaN substrates thus obtained, the substrate diameter of the GaN substrate of the lowermost layer portion was about 6 inches, while the substrate diameter of the GaN substrate of the uppermost layer portion was about 4 inches. Thus, in Comparative Example 2, the GaN crystal formed on the seed substrate became more dwarfed toward the upper layer. For this reason, it was impossible to obtain a large number of intended GaN substrates of φ 6 inches, and the diameters of the obtained GaN substrates were irregular.

Among the seven GaN substrates thus obtained, in the GaN substrate of the uppermost layer portion, the average of three arbitrary points in the plane was 1350 arcsec and the variation was 200 arcsec in the FWHM of the X-ray rocking curve of the (100) plane, and this substrate was a substrate having extremely poor crystallinity. Incidentally, as a result of the chemical analysis of the surface of each of the substrates described above, the content of the metal impurities was 5300 ppm by mass in the GaN substrate of the uppermost layer portion and 95000 ppm by mass in the GaN substrate of the lowermost layer portion, and the content of the metal impurities was also large. Such a GaN substrate having a high content of metal impurities cannot be supplied to a device producing line due to concern about contamination of the line.

Further, as a result of observation of a stacking fault in a monochromatic Cathode Luminescence image, many stacking faults were observed in the GaN substrate of the uppermost layer portion and the GaN substrate of the lowermost layer portion.

Example 4

(1) Production of Base Substrate

An AlN substrate having a diameter of 155 mm was produced as a base substrate in the same manner as in Example 1 except that the $GaCl_3$ gas was replaced with $AlCl_3$ gas and the reaction temperature was changed from 1250° C. to 1500° C. The coefficient of thermal expansion of the AlN substrate is about 5.7 ppm at 500° C.

(2) $SiO_2$ Film Formation (Intermediate Layer Formation)

On the upper surface of the base substrate, an $SiO_2$ film was formed by stacking 0.6 μm of $SiO_2$ by a plasma CVD apparatus, and the $SiO_2$ film was lightly polished by CMP to make the $SiO_2$ film having a thickness of 0.5 μm.

(3) Thin Film Transfer of Seed Substrate

A plurality of φ 2-inch AlN substrates (thickness: 200 μm) were produced by the flux method. The plurality of φ 2-inch AlN substrates were processed into a honeycomb shape. Using an inorganic adhesive, the plurality of honeycomb-shaped AlN substrates were attached to a separately prepared glass substrate so as to form a φ 6-inch disk. Then, hydrogen ions were implanted into the AlN substrate to a depth of 1 μm, and the hydrogen ion-implanted surface of the AlN substrate into which hydrogen ions were implanted was bonded to the base substrate on which an $SiO_2$ film was formed, thereby bonding the AlN substrate to the base substrate. Thereafter, the AlN thin film was peeled off from the AlN substrate, and the AlN thin film having a thickness of 1 μm was transferred to the base substrate. Then, the transferred AlN thin film was lightly polished by CMP to the thickness of the AlN thin film of 0.9 μm, and this was used as a seed substrate.

(4) Production of Large-Sized, High-Quality AlN Substrate

An AlN crystal was formed on the seed substrate by continuing the THVPE reaction for 40 hours using the above-described seed substrate under the same conditions as when the base substrate was produced by the apparatus used in the production of the base substrate. The obtained AlN crystal was free from warpage and deformation even after cooling, and a large-sized and thick AlN crystal was obtained. This AlN crystal was processed to φ 150 mm× thickness of about 10 mm by a lathe, and then subjected to diamond cutting and double-side polishing to produce seven AlN substrates of Example 4 of φ 150 mm× thickness of 625 μm.

(5) Evaluation of the Obtained AlN Substrate

Among the seven AlN substrates thus obtained, in the AlN substrate of the uppermost layer portion, the average of three arbitrary points in the plane was 23 arcsec and the variation was 3 arcsec in the FWHM of the X-ray rocking curve of the (100) plane, and this substrate was a substrate having extremely good crystallinity. On the other hand, in the AlN substrate of the lowermost layer portion among the seven substrates, the average of three arbitrary points in the plane was 45 arcsec and the variation was 8 arcsec in the FWHM of the X-ray rocking curve of the (100) plane, and the crystallinity was slightly inferior to that of the AlN substrate of the uppermost layer portion, but this substrate was also a substrate having good crystallinity. Incidentally, as a result of the chemical analysis of the surfaces of the above-described substrates, the metal contamination of the AlN substrate was below the detection limit in both the AlN substrate of the uppermost layer portion and the AlN substrate of the lowermost layer portion.

Further, as a result of observation of a stacking fault in a monochromatic Cathode Luminescence image, no stacking fault was observed at all in the AlN substrate of the uppermost layer portion and the lowermost layer portion. From the above results, it was shown that the AlN substrate of Example 4 was a large-sized and high-quality AlN substrate.

Example 5

(1) Production of Base Substrate

A base substrate in the form of a φ 6-inch wafer was produced in the same manner as in Example 3.

(2) $Si_3N_4$ Film Formation (Intermediate Layer Formation)

On the upper surface of the base substrate, an $Si_3N_4$ film was formed by stacking 0.5 μm of $Si_3N_4$ using a plasma CVD apparatus, and the $Si_3N_4$ film was lightly polished by CMP to make the $Si_3N_4$ film having a thickness of 0.4 μm.

(3) Thin Film Transfer of Seed Substrate

As in Example 3, a plurality of φ 2-inch SCAM substrates (thickness: 220 μm) were processed into a honeycomb shape. Using an inorganic adhesive, the plurality of honeycomb-shaped SCAM substrates were attached to a separately prepared glass substrate so as to form a φ 7-inch disk. Then, hydrogen ions were implanted into the SCAM substrate to a depth of 1 μm, and the hydrogen ion-implanted surface of the SCAM substrate into which hydrogen ions were implanted was bonded to a base substrate on which an $Si_3N_4$ film was formed, thereby bonding the SCAM substrate to the base substrate. Then, the SCAM thin film was peeled off from the SCAM substrate, and the SCAM thin film having a thickness of 1 μm was transferred to the base substrate. The transferred SCAM thin film was lightly polished by CMP to make the SCAM thin film having a thickness of 0.7 μm, which was used as a seed substrate.

(4) Production of Large-Sized, High-Quality GaN Substrate

In the same manner as in Example 1, a GaN crystal was formed on the seed substrate, and the obtained GaN crystal was processed to produce a GaN substrate. The obtained GaN crystal could be easily peeled off from the SCAM thin film which is the seed substrate.

(5) Evaluation of the Obtained GaN Substrate

Among the seven GaN substrates thus obtained, in the GaN substrate of the uppermost layer portion, the average of three arbitrary points in the plane was 16 arcsec and the variation was 2 arcsec in the FWHM of the X-ray rocking curve of the (100) plane, and this substrate was a substrate having good crystallinity. On the other hand, in the GaN substrate of the lowermost layer portion among the seven substrates, the average of three arbitrary points in the plane was 22 arcsec and the variation was 3 arcsec in the FWHM of the X-ray rocking curve of the (100) plane, and the crystallinity of the GaN substrate of the lowermost layer portion was substantially equal to the crystallinity of the GaN substrate of the uppermost layer portion. Incidentally, as a result of the chemical analysis of the surfaces of the above-described substrates, the metal contamination of the GaN substrate was below the detection limit in the GaN substrates of the uppermost layer portion and the lowermost layer portion.

Example 6

(1) Production of Base Substrate

Using $GaCl_3$ and $NH_3$ as raw materials, a GaN base substrate having a diameter of 8 inches and a thickness of 800 μm was produced under the same conditions as in Example 1.

(2) Formation of Peeling Layer

A plurality of φ 2-inch SCAM substrates (thickness: 600 μm) were processed into a honeycomb shape. This was spread on the above-mentioned base substrate and attached with an alumina-based inorganic adhesive to form a peeling layer.

(3) $SiO_2$ Film Formation (Intermediate Layer Formation)

A $SiO_2$ film having a thickness of 2 μm was stacked on the surface of the peeling layer by a sputtering apparatus, and the surface of the $SiO_2$ film was polished by CMP to have a surface roughness Ra of the $SiO_2$ film of 0.5 μm.

(4) Thin Film Transfer of Seed Substrate

A hydrogen-ion-implanted surface of a φ 8-inch Si<111> wafer into which hydrogen ions were implanted to a depth of 0.35 μm was bonded to the base substrate on which an $SiO_2$ film was formed on a peeling layer and bonded to the base substrate, and then the Si<111> thin film was peeled off from the ion-implanted portion of the Si<111> wafer, and the Si<111> thin film having a thickness of 0.35 μm was transferred to the base substrate.

Three composite substrates having a structure of (GaN base substrate)/(SCAM peeling layer)/($SiO_2$ film)/(Si<111> seed substrate) were prepared.

On this seed substrate, a low-temperature MOCVD reaction was carried out for 3 hours at a film formation temperature of 550° C. using trimethylgallium (TMG) and $NH_3$ as raw materials, and stacking 0.6 μm of an N-face GaN crystal on the seed substrate. The total thickness of the seed substrate and the N-face GaN crystal was 1.1 μm.

(5) Production of Large-Sized, High-Quality GaN Substrate

A GaN crystal was formed on the seed substrate by continuing the THVPE reaction at a crystal growing rate of about 200 μm/h for 100 hours using the above-described seed substrate under the same conditions as when the base substrate was produced by the apparatus used in the production of the base substrate.

After cooling, the obtained GaN crystal was integrated with the seed crystal of Si<111>, and an integrated product was easily peeled off from the SCAM crystal due to the cleavage property of the SCAM of the peeling layer, and the SCAM of the peeling layer was recovered and used for reuse. On the other hand, the peeled integrated product of the GaN crystal and the Si<111> seed crystal was first cylindrically ground, then the Si<111> seed crystal was polished and removed, and then sliced to have a thickness of 800 μm. The obtained 16 GaN substrates were subjected to final CMP polishing from lap polishing to obtain a product of a smooth GaN substrate having a thickness of 625 μm. Incidentally, in the GaN substrate immediately after the crystal growth, thermal stress was absorbed by successive cleavage during reaction due to the function of SCAM of the peeling layer, so that warpage hardly occurred and cracks did not occur at all.

(6) Evaluation of the Obtained GaN Substrate

In the obtained 16 GaN substrates, the FWHM of the X-ray rocking curve of the (100) plane was such that the average at the center in the plane was 30 arcsec and the variation was 3 arcsec. Further, even at three arbitrary points of these substrates, the average was 53 arcsec and the variation was 6 arcsec, and the crystallinity was good. Incidentally, as a result of chemical analysis of the surfaces of the above-described substrates, the metal contamination of all GaN substrates was below the detection limit.

Further, as a result of observation of a stacking fault in a monochromatic Cathode Luminescence image, stacking faults were hardly observed in the surface layer of the obtained GaN substrate. From the above results, it was found that the obtained GaN substrate was a uniform and good GaN crystal substrate having no warpage and almost no variation.

Example 7

(1) Production of Base Substrate

A high-purity GaN powder was prepared in the same manner as in Example 2. To 100 parts by mass of the GaN powder, 10 part by mass of Ga metal was added and mixed to prepare a mixture. Under the conditions of a pressure of 30 kg/cm$^2$ and a temperature of 25° C., the mixture was pressurized and molded by a pressing press to prepare a molded body. The molded body was nitrided and sintered at a firing temperature of 1200° C. in a gas mixture atmosphere of 10 vol % N$_2$ gas and 90 vol % NH$_3$ gas to produce a base substrate.

(2) Formation of Peeling Layer

A φ 8-inch PBN substrate (thickness: 600 μm) was bonded to the surface of the base substrate with an alumina-based inorganic adhesive to form a peeling layer.

(3) Si$_3$N$_4$ Film Formation (Intermediate Layer Formation)

A Si$_3$N$_4$ film was stacked on the surface of the peeling layer by a plasma CVD apparatus, and the surface of the Si$_3$N$_4$ film was polished to have a surface roughness Ra of the Si$_3$N$_4$ film of 0.5 μm.

(4) Thin Film Transfer of Seed Substrate

A hydrogen-ion-implanted surface of a sapphire wafer having a diameter of 8 inches into which hydrogen ions were implanted to a depth of 0.35 μm was bonded to the Si$_3$N$_4$ film of the intermediate layer on the base substrate, and the sapphire wafer was bonded to the base substrate. Then, a sapphire thin film was peeled off from the ion-implanted portion of the sapphire wafer, and the sapphire thin film having a thickness of 0.35 μm was transferred to the base substrate.

Three composite substrates having a structure of (GaN base substrate)/(PBN peeling layer)/(Si$_3$N$_4$ film)/(sapphire seed substrate) were prepared.

On this seed substrate, a low-temperature MOCVD reaction was carried out for 3 hours at a film formation temperature of 550° C. using trimethylgallium (TMG) and NH$_3$ as raw materials, and stacking 0.6 μm of an N-face GaN crystal on the seed substrate. The total thickness of the seed substrate and the N-face GaN crystal was 1.1 μm.

(5) Production of Large-Sized, High-Quality GaN Substrate

A GaN crystal was formed on the seed substrate using the apparatus used in the production of the base substrate under the same conditions as those in the production of the base substrate. The crystal growth rate was set to about 200 μm/h, and the GaN film growth was continued for 100 hours.

After cooling, the obtained GaN crystal was easily peeled off from the PBN of the peeling layer in a form integrated with the seed substrate. The thermal stress during cooling, which was feared, was absorbed by interlayer peeling. As a result, cracks did not occur in the GaN crystal, and also warpage hardly occurred.

(6) Evaluation of the Obtained GaN Substrate

In the obtained GaN substrate, the FWHM of the X-ray rocking curve of the (100) plane was such that the average of three arbitrary points in the plane was 55 arcsec and the variation was 6 arcsec. The analytical value of metal impurities was below the measurement limit. Further, as a result of observation of a stacking fault in a monochromatic Cathode Luminescence image, stacking faults were hardly observed in the surface layer of the GaN substrate. From the above-described measurement and observation, it was found that the obtained GaN crystal was a uniform and good crystal substrate with very little variation.

REFERENCE SIGNS LIST

1: Inside of reaction apparatus
2: GaN crystal
3: Susceptor
4: Susceptor revolution jig
5: Gas supply pipe
6: Center pipe
7: Outermost pipe
8: Second pipe
9: Heating device
10: Heat-insulating material

The invention claimed is:

1. A method for producing a group III compound crystal, comprising:
    a base substrate forming step for forming a group III nitride base substrate by a vapor phase synthesis method;
    a seed substrate forming step for forming a seed substrate on the base substrate; and
    a group III compound crystal forming step for forming a group III compound crystal on the seed substrate by a hydride vapor phase epitaxy method,
    wherein the base substrate is
    a substrate obtained by molding a powder of a group III nitride obtained by a vapor phase reaction of a Group III chloride and NH$_3$ to prepare a molded body, incorporating a group III metal into the molded body by an impregnation method, and sintering the molded body,
    a substrate obtained by molding a powder of a group III nitride obtained by a vapor phase reaction of a Group III chloride and NH$_3$ to prepare a molded body, incorporating a group III compound that becomes a group III metal upon reduction into the molded body by an impregnation method, and nitriding and sintering the molded body, or
    a substrate obtained by preparing a mixture by adding and mixing a group III metal to a powder of a group III nitride obtained by a vapor phase reaction of a Group III chloride and NH$_3$, molding the mixture to prepare a molded body, and nitriding and sintering the molded body.

2. The method for producing a group III compound crystal according to claim 1, wherein the hydride vapor phase epitaxy method used in the group III compound crystal forming step is a THVPE method.

3. The method for producing a group III compound crystal according to claim 1,
    wherein the group III nitride of the base substrate is GaN or AlN, the seed substrate is a substrate of Si<111>, sapphire, SiC, GaAs, SCAM (ScAlMgO$_4$), or GaN,
    wherein in the seed substrate forming step, the seed substrate is formed on the base substrate by thin film transfer of the seed substrate to the base substrate, and
    wherein in the group III compound crystal forming step, the group III compound crystal is formed on the seed substrate using a group III chloride and NH$_3$ as vapor phase epitaxy raw materials.

4. The method for producing a group III compound crystal according to claim 1, wherein the base substrate is a substrate of at least one material selected from the group consisting of amorphous, polycrystal, single crystal, and ceramics of a group III nitride, and wherein the total content of metal impurities other than group III metal elements in the base substrate is 5000 ppm by mass or less.

5. The method for producing a group III compound crystal according to claim 1, wherein in the base substrate forming step, a group III nitride base substrate is formed by a hydride vapor phase epitaxy method.

6. The method for producing a group III compound crystal according to claim 1, wherein the group III compound crystal is a gallium nitride (GaN) crystal or an aluminum nitride (AlN) crystal.

7. The method for producing a group III compound crystal according to claim 1, further comprising an N-face group III nitride layer forming step of forming an N-face group III nitride layer on the seed substrate between the seed substrate forming step and the group III compound crystal forming step.

8. The method for producing a group III compound crystal according to claim 7, wherein in the N-face group III nitride layer forming step, the N-face group III nitride layer is formed on the seed substrate by a low-temperature MOCVD method at a temperature of 400 to 800° C. or by a THVPE method.

9. The method for producing a group III compound crystal according to claim 8, wherein in the N-face group III nitride layer forming step, the N-face group III nitride layer is formed on the seed substrate by a low-temperature MOCVD method at a temperature of 500 to 600° C.

10. The method for producing a group III compound crystal according to claim 1, wherein the thickness of the seed substrate or the sum of the thickness of the seed substrate and the thickness of the N-face group III nitride layer formed in the N-face group III nitride layer forming step is 50 to 2000 nm.

11. The method for producing a group III compound crystal according to claim 1, further comprising a peeling layer forming step of forming a peeling layer made of a material which can be cleaved, on the base substrate, wherein in the seed substrate forming step, the seed substrate is formed on the peeling layer.

12. The method for producing a group III compound crystal according to claim 11, wherein the material having a peelable cleavage property is at least one material selected from the group consisting of SCAM (ScAlMgO$_4$) crystal, boron nitride (BN), and graphite.

13. The method for producing a group III compound crystal according to claim 11, further comprising an intermediate layer forming step of forming an intermediate layer on the peeling layer, wherein the intermediate layer is a film of an Si-based compound, and in the seed substrate forming step, the seed substrate is formed on the intermediate layer.

14. The method for producing a group III compound crystal according to claim 1, further comprising an intermediate layer forming step of forming an intermediate layer on the base substrate, wherein the intermediate layer is a film of an Si-based compound, and in the seed substrate forming step, the seed substrate is formed on the intermediate layer.

* * * * *